Sept. 12, 1967 J. D. HUSHER ET AL 3,341,755

SWITCHING TRANSISTOR STRUCTURE AND METHOD OF MAKING THE SAME

Filed March 20, 1964 2 Sheets-Sheet 1

WITNESSES:

John G. Chopp

James F. Young

INVENTORS
John D. Husher and
Larry J. Pollock

BY Gordon H. Telfer

ATTORNEY

Sept. 12, 1967 J. D. HUSHER ET AL 3,341,755

SWITCHING TRANSISTOR STRUCTURE AND METHOD OF MAKING THE SAME

Filed March 20, 1964 2 Sheets-Sheet 2

United States Patent Office 3,341,755
Patented Sept. 12, 1967

3,341,755

SWITCHING TRANSISTOR STRUCTURE AND METHOD OF MAKING THE SAME

John D. Husher, Ellicott City, and Larry J. Pollock, Odenton, Md., assignors to Westinghouse Electric Corporation, Pittsburgh, Pa., a corporation of Pennsylvania Filed Mar. 20, 1964, Ser. No. 353,524
3 Claims. (Cl. 317—235)

This invention relates generally to semiconductor junction transistors and more particularly to transistor structures intended for operation in the switching mode and which are incorporated within integrated circuitry.

This invention particularly applies to transistor structures of the type wherein the base-collector junction terminates on the same surface as that on which the emitter is disposed (frequently referred to as a planar type structure) and where contact to the collector is to be made on that same surface.

While in single transistor devices, a collector contact on the upper surface is generally not necessary, such a necessity does arise in integrated circuits employing a passive substrate where access to the collector is not available on the bottom surface. At present, transistor structures in such integrated circuits, in the switching mode, have an undesirably high saturation voltage and long switching time that generally makes them compare unfavorably with available single transistors.

It is, therefore, an object of the present invention to provide a switching transistor structure, suitable for incorporation within integrated circuitry, with reduced saturation voltage and switching time.

Another object is to provide a transistor structure wherein contacts to each of the emitter, base and collector regions may be made to the same surface with a lower resistance path for carriers to travel through the collector region to the collector contact than has been previously available.

Another object is to provide a transistor structure wherein the volume of the collector region wherein it is possible for minority carriers to be stored is minimized so that the switching time is shortened.

Another object is to provide a method of making a switching transistor structure having low saturation voltage and short switching time in an integrated circuit.

The present invention, in brief, achieves the above-mentioned and additional objects and advantages by the provision of a highly doped portion or wall of the same semiconductivity type as the collector region, extending from the contacting surface to the highly doped layer forming the bottom portion of the collector region.

The highly doped wall, by reason of its relatively low resistivity compared with the bulk of the collector region, reduces the resistance encountered by carriers traveling between the collector junction and the collector contact. Measurements indicate about a 50% reduction in saturation resistance and, hence, a corresponding improvement in saturation voltage, compared with structures otherwise the same but without the highly doped wall.

In addition, restriction of the volume of the collector region reduces the storage time and hence reduces the switching time so that it is only about 80% as long as in prior structures of the same junction area.

In accordance with the method of the present invention, the highly doped wall is formed by impurity diffusion. A quantity of doping impurity is deposited at the desired location and is driven, or diffused, through the collector region in the same heating operations to which the structure is subjected for diffusion of the base and emitter regions. This means that in accordance with this method the fabrication time is not greatly lengthened nor the cost greatly increased. The ability to integrate other active and passive elements with such a structure is not at all adversely affected.

While the improved characteristics achieved by this invention are primarily advantageous in structures employed as switching transistors, they may also be applied to transistor structures intended to operate as amplifiers where the features of this invention will provide improved frequency response.

The present invention, together with the above-mentioned and additional objects and advantages thereof, will be more readily understood with reference to the following description, taken in connection with the accompanying drawing, in which.

Figure 2:
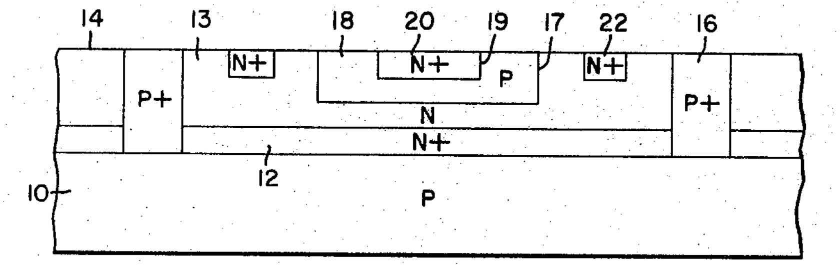
Fig. 2. PRIOR ART
FIG. 2 is a cross-sectional view of the structure of FIG. 1 taken along the line II—II.

The illustrative structures shown in the drawing are indicated as being only partial views of integrated circuits inasmuch as the improved transistor structure in accordance with the present invention can be applied in accordance with present integrated circuit technology with other active and passive elements. The formation of other elements, such as resistors, capacitors, diodes and field effect transistors, with the transistor structure in accordance with this invention, will be apparent to those skilled in the art.

The drawing also shows the illustrative embodiments as being of a particular semiconductivity type so that the transistor structures illustrated are of NPN polarity. However, it will be apparent that the semiconductivity type of the various regions may be reversed from that shown so as to provide transistor structures of PNP polarity. Furthermore, it will be noted that the dimensions used in the drawing are greatly exaggerated, particularly in the thickness dimension, for clarity of illustration. The determination of the shape, area and thickness of the various regions of structures in accordance with this invention will be apparent to those skilled in the art from known considerations having to do with such matters as powers handling capability, gain and others.

Figure 1:
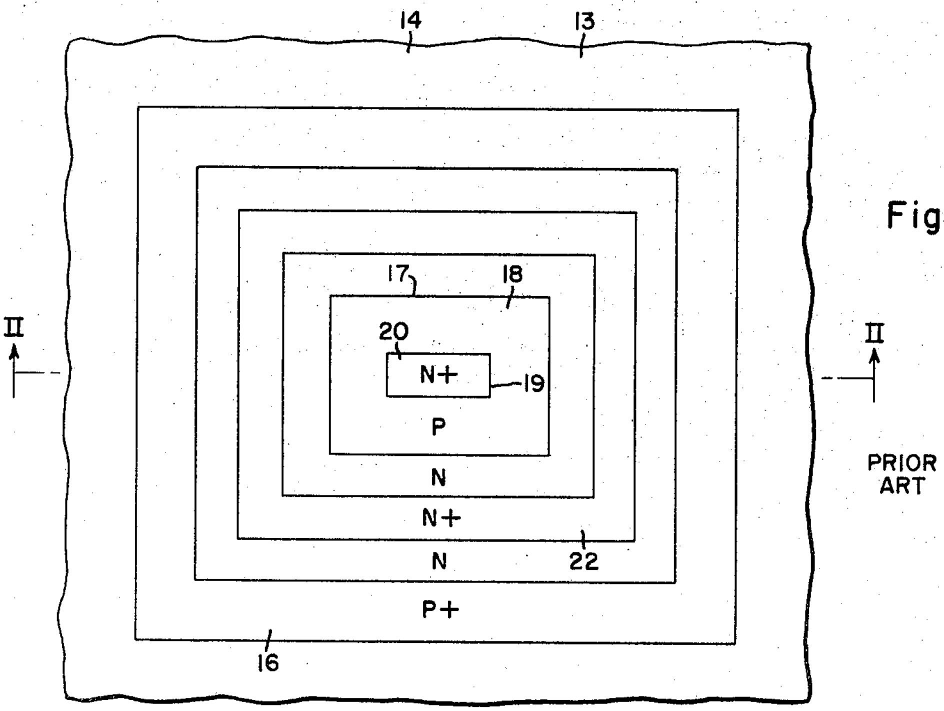
Fig. 1. PRIOR ART
FIGURE 1 is a plan view of part of a semiconductor integrated circuit illustrating a transistor structure in accordance with the prior art.

FIGS. 1 and 2 illustrate a transistor structure that is conventionally employed in integrated circuitry up to the present ime. On a P-type substrate 10, N+ and N-type layers 12 and 13, respectively, are disposed. In accordance with known techniques, the layers 12 and 13 may be epitaxially grown on the substrate 10. Alternatively, the N+ layer 12 may be formed by the diffusion of a donor type impurity such as arsenic into the surface of the substrate 10 with the layer 13 then being epitaxially grown over the diffused layer.

As is known, the use of the two layers 12 and 13 is for the purpose of providing a low impurity concentration in that portion of the collector region at which the collector junction is formed and to provide a higher impurity concentration underlying that portion to reduce the saturation resistance of the transistor structure. Copending application Ser. No. 193,452, filed May 9, 1962 by H. C. Lin and assigned to the assignee of the present invention, now Patent 3,236,701, issued Feb. 22, 1966, should be referred to for further discussion of integrated circuit transistor structures having a varying resistivity in the collector region.

The P-type base region 18 is diffused into the N-type layer 13. Subsequently, the N+ type emitter 20 is diffused into the base region 18. At the same time that the emitter region is diffused, a high concentration N+ region 22 is diffused into the collector region 13 to serve as a collector contact region. The purpose of the N+ region 22 is to provide highly doped material so that ohmic contacts may be readily formed therewith by the evaporation and bonding of a metal such as aluminum. The structure also illustrates a P+ isolation wall 16 surrounding the transistor structure and serving the known purpose of isolating it from other portions of the semiconductive device. The P+ isolation wall 16 is formed by the diffusion of impurities entirely through the layers 12 and 13 from the major surface 14 to the substrate 10. This diffusion is usually performed prior to the diffusions for the regions 18, 20 and 22. It will be noted that the PN junctions 17 and 19 formed by the base 18 and emitter 20, respectively, terminate at the major surface of the structure 14. The diffusion operations are performed by depositing doping material in openings in oxide masks formed by photo-resist and etching techniques.

In integrated circuitry of the type illustrated, a problem is encountered in transistor structures not encountered in single transistor devices. Here it is desired to make contact to the collector region 13 on the upper major surface 14 of the structure. When such a structure is operated in the switching mode, that is, where it is operated between saturation (both junctions forward biased with maximum collector current) and cut-off (both junctions reverse biased with minimum collector current), it is desirable that the impedance in the on condition, saturation, be low. That is, the resistance and voltage exhibited by the transistor in saturation, for given load conditions, should be minimized.

However, in the prior art structures, such as that illustrated, the flow of majority current carriers, electrons in an NPN structure, is from the emitter 20, across the base region 18, across the N-type region 13 to the N+ region 12, along the N+ region 12, through the N-type region 13 outside the base region and up to the N+ region 22. This relatively long path length compared with the individual transistor structures causes the current carriers to encounter relatively high resistance and therefore makes the saturation resistance and saturation voltage of the device relatively high.

Another disadvantage of the prior art structure is that the entire volume of the layers 12 and 13 within the isolation wall 16 is available for the storage of minority carriers and as such increases the switching time of the device, that is, the time required to affect a reversal of the device between the on and off states.

Figure 3:
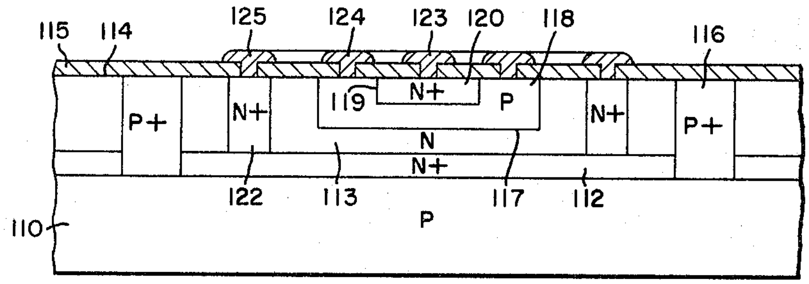
FIG. 3 is a cross-sectional view of part of an integrated circuit illustrating a transistor structure in accordance with the present invention.

FIG. 3 illustrates a structure in accordance with the present invention. The plan view would appear the same as in prior art structures. The elements of the structure of FIG. 3 are indicated by reference numerals having the same last two digits as the corresponding elements of the structure of FIGS. 1 and 2. In FIG. 3, the N+ region 122 is disposed not merely on the surface 114 of the device but extends from that surface through the collector N-type region 113 to the underlying N+ region 112. As a result, the resistance of the path that carriers must travel from the collector junction 117 to the surface of the N+ region 122 is reduced.

Typically, the N+ layer 112 has a resistivity of about 25 ohms per square, the N layer 113 has a resistivity of about 120 ohms per square and the N+ wall 122 has an average resistivity of about 3 ohms per square. Typical dimensions are for the layers 112 and 113 to be about 4 microns and 12 microns, respectively, in thickness with the junctions 117 and 119 at depths of about 4 microns and 3 microns, respectively. A typical improvement in saturation voltage has been from about 0.25 volt at 20 milliamperes with prior art structures to about 0.14 volt at the same current with structures in accordance with this invention.

Ohmic contacts are shown applied to each of the regions of the transistor. A contact 123 is applied to the emitter region 120. A contact 124 is applied to the base region 118 and extends around the emitter region. A contact 125 is applied to the N+ region 122 and extends around the emitter and base regions. The contact configuration is determined by the necessity of making interconnections from the regions of the illustrated transistor structure to other portions of the integrated circuit by conductive interconnections extending over the surface passivating layer 115 disposed on the entire surface of the device except where contacts are disposed. For that reason, the contacts 124 and 125 to the base and collector regions, respectively, will not ordinarily be closed rings but will have gaps therein to permit conductive interconnections to pass through them to the inner contacts.

It is known that in conventional transistors where the collector contact is disposed on the bottom surface remote from the emitter that the storage time in the switching mode increases as the square of the thickness of the collector region increases. In transistor structures in integrated circuits with the collector contact on the same surface as the emitter region, minority carrier storage is further increased by the lateral volume of the collector region as well. In the switching mode, the collector junction is forward biased in saturation and holes are injected into the N-type collector region 113 not only directly under emitter region 120 but also from the entire surface area of the collector junction 117. In prior structures, such as that of FIG. 2, these carriers could travel throughout the collector region 113 to the extent permitted by the isolation wall 116. However, in the structure in accordance with this invention, the carriers only travel to the extent permitted by the N+ diffused region 122 and the total volume available for storage is reduced without decreasing the junction area in the transistor structure or adversely affecting other parameters of the device.

Figure 4:
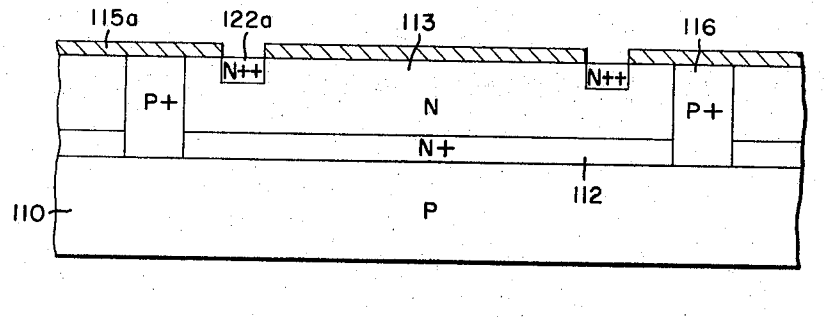
FIGS. 4, 5 and 6 are cross-sectional views of semiconductor structures to illustrate the successive fabrication steps in accordance with the method of the present invention to achieve a structure like that shown in FIG. 3.
Figure 5:
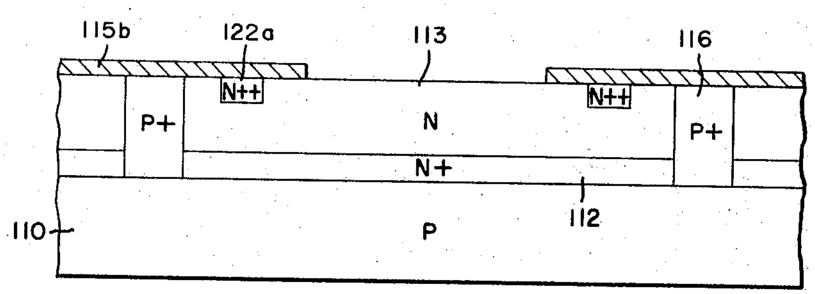
Figure 6:
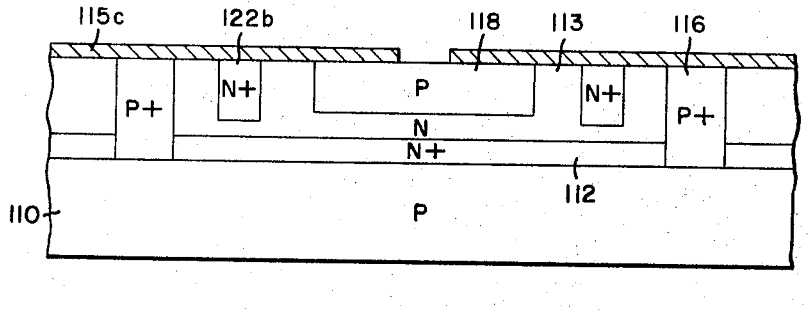

FIGS. 4, 5 and 6 illustrate successive stages in the fabrication process to achieve the structure illustrated in FIG. 3. The fabrication of the structure to the extent of providing the P-type substrate 110, the N+ and N-type layers 112 and 113 and the P+ type isolation wall 116 may be in accordance with the prior art techniques used for the fabrication of structures such as that illustrated in FIGS. 1 and 2. However, after the diffusion of the isolation wall 116 and prior to diffusion of the base and emitter regions, a deposition of N-type impurities **122*a* is made through an oxide mask 115*a* on the surface in the position desired for the N+ region 122. The deposition 122*a* is indicated as being of N++ conductivity type because of the high impurity concentration resulting from the deposition. However, at this stage in the process, the donor type impurities in the deposition 122*a* are not driven appreciably into the N-type region 113**, since it is desired to minimize the number of heating operations and the total fabrication time to which the device structure is subjected.

FIG. 5 shows the same structure after the oxide **115*b* has been reformed on the surface and a new aperture opened in the position desired for the diffusion of the base region 118. During the reforming of the oxide and the opening of the base diffusion window by photo-resist and etching techniques, the impurity deposition 122*a* does not diffuse appreciably within the region 113. The P-type impurities for the diffusion of the base region are deposited in the opening of the oxide layer 115*b* and are redistributed by application of heat to the structure for a predetermined period of time to achieve the desired depth of the base region 118. At the same time, the impurity deposition 122*a* is driven into the region 113 and, since a diffusion of N-type impurities into an N-type region occurs at a quicker rate than that of P-type impurities into an N-type region, the impurities in the deposition 122$a$ penetrate further into the region 113 than those deposited for the base region 118**.

FIG. 6 illustrates the structure after the P-type base diffusion and the driving of the N-type impurities to form a new portion of diffused N-type material 122$b$ that extends into the region 113 farther than the region 118. It may be the case that the N-type impurities for the region 122 will at this stage in the fabrication process penetrate through the N-type region 113 to the N+ layer 112 and hence complete the formation of the region 122. However this is not necessary as a diffusion is required to form the emitter region 120.

In FIG. 6, another oxide mask 115$c$ is disposed on the surface 114 for the emitter diffusion and has an opening within the base region 118. In the subsequent processing, not illustrated, an N-type impurity is deposited in the opening in the mask 115$c$ and driven for the formation of the emitter region 120 and, at the same time, the impurities in the region 122$b$ will further diffuse through the N+ layer 112, if they have not already done so in the prior base diffusion, to complete the structure. It is, therefore seen that the method in accordance with this invention requires only one additional deposition, that designated as 122$a$ in FIG. 4. This single additional deposition does not appreciably extend the processing time nor the heating to which the semiconductive structure is subjected and is achieved without appreciable additional fabrication expense.

It will be appreciated that the structure in accordance with this invention may be fabricated by process operations differing from those described in connection with FIGS. 4, 5 and 6. For example, one alternative is that the deposition of impurities to form the region 122 be performed immediately prior to or immediately subsequent to deposition of impurities for the isolation wall 116 so that the driving of the impurities for the region 122 will be at least partially completed in the diffusion of the impurities for the isolation wall 116.

The specific process techniques employed for the epitaxial growth, impurity diffusion and oxide masking utilized in the practice of the present invention may be in accordance with known techniques and hence need not be extensively discussed herein. The deposition for the formation of the N+ region 122 may be the same as that previously performed for the formation of the region 22 in structures like that of FIG. 2 but since the impurities are subjected to a longer diffusion time by reason of their presence during the diffusions of both the base and emitter regions they penetrate further into the collector region. It has been found that a quantity of phosphorous containing impurity deposited in the location desired for the region 122 having a sheet resistivity of at least about 2 ohms per square is sufficient for this purpose. A higher concentration deposition may be used to decrease the saturation resistance further.

Examples of epitaxial growth and diffusion techniques suitable for use in the practice of this invention may be found by referring to copending application Ser. No. 284,611, filed May 31, 1963, by H. C. Lin and assigned to the assignee of the present invention, now Patent 3,197,710, issued July 27, 1965.

While the present invention has been shown and described in only a few forms, it will be apparent that it is subject to changes and modifications without departing from the spirit and the scope thereof.

What is claimed is:

1. A switching transistor structure comprising: emitter, base and collector regions in a body of semiconductive material having a major surface; a base-collector junction between said base and collector regions that terminates at said major surface; said collector region having an impurity concentration that is greatest in a layer remote from said base-collector junction and from said major surface; a wall of semiconductive material of the same type as said collector spaced from said base region and extending from said major surface to said layer; said wall having an impurity concentration that is greater than that of said collector region immediately adjacent said P-N junction; said wall and said layer cooperating to enclose the remainder of said collector region.

2. A semiconductor device structure capable of operation as a high speed switching transistor with low saturation voltage in an integrated circuit comprising: a substrate of a first type of semiconductivity; a first layer of a second type of semiconductivity on said substrate; a second layer of said second type on said first layer, said second layer having a lower impurity concentration than said first layer; an isolation wall of material of said first type extending through said first and second layers and enclosing portions of said first and second layers; a first region of said first type in one of said enclosed portions of said second layer and forming a first P-N junction therewith that terminates at a major surface of said structure; a second region of said second type in said first region and forming a second P-N junction therewith that also terminates at said major surface; a wall of material of said second type also enclosed by said isolation wall and extending from said major surface to said first layer, said second type wall having a higher impurity concentration than said second layer to provide a low resistance current path through said second layer, said second type wall also restricting the volume of material in said second layer wherein minority carriers can be stored.

3. In a semiconductor integrated circuit, a structural portion capable of operation as a high speed switching transistor with low saturation voltage comprising: emitter, base and collector regions; an emitter junction between said emitter and base regions; a collector junction between said base and collector regions, each of said junctions terminating at a major surface of said integrated circuit with portions of said emitter, base and collector regions extending to said major surface; said collector region comprising a first portion immediately adjacent said collector junction of a first average resistivity and a second portion underlying said first portion of a second average resistivity less than said first average resistivity; a wall of semiconductive material of the same semiconductivity type as said collector region enclosing and spaced from said collector junction and having an average resistivity that is also less than said first average resistivity; said wall extending from said major surface to said second portion of said collector to provide a low resistance current path through said collector region to said major surface, said wall also restricting the volume of said collector region in which minority carriers can be stored; ohmic contacts on said major surface in contact with each of said base and emitter regions and with said wall, said contact on said wall serving as the collector contact.

References Cited

UNITED STATES PATENTS

| | | | |
|---|---|---|---|
| 3,138,747 | 6/1964 | Stewart | 317—235 |
| 3,173,069 | 3/1965 | Stehney | 317—235 |
| 3,176,376 | 4/1965 | Kelley | 29—25.3 |
| 3,178,798 | 4/1965 | Marinace | 29—25.3 |
| 3,226,614 | 12/1965 | Haenichen | 317—234 |
| 3,229,119 | 1/1966 | Bohn et al. | 306—88.5 |
| 3,252,063 | 5/1966 | Ziffer | 317—235 |

JAMES D. KALLAM, *Primary Examiner.*

JOHN W. HUCKERT, *Examiner.*

R. SANDLER, *Assistant Examiner.*